United States Patent [19]

Thomas

[11] 4,002,974
[45] Jan. 11, 1977

[54] METHOD AND APPARATUS FOR TESTING CIRCUITS

[75] Inventor: Edward Wherry Thomas, Hanover Township, Morris County, N.J.

[73] Assignee: Bell Telephone Laboratories, Incorporated, Murray Hill, N.J.

[22] Filed: Nov. 13, 1975

[21] Appl. No.: 631,731

[52] U.S. Cl. .................. 324/73 R; 235/153 AC
[51] Int. Cl.² .................. G01R 15/12
[58] Field of Search ........ 324/73 R, 73 AT, 73 PC; 235/153 AC

[56] References Cited

UNITED STATES PATENTS

| | | | |
|---|---|---|---|
| 3,562,644 | 2/1971 | DeWolf | 324/73 |
| 3,633,016 | 1/1972 | Walker et al. | 235/153 |
| 3,673,397 | 6/1972 | Schaefer | 235/153 |
| 3,728,616 | 4/1973 | Cheek et al. | 324/51 |
| 3,772,595 | 11/1973 | De Wolf et al. | 324/73 R |
| 3,826,909 | 7/1974 | Ivashin | 235/153 |
| 3,883,802 | 5/1975 | Puri | 324/73 R |
| 3,916,306 | 10/1975 | Patti | 324/73 R |

OTHER PUBLICATIONS

Testing Complex Mos: The How and Why, Ron Danklefs and Homer Thornton, The Electronic Engineer, Oct. 1970, vol. 29, No. 10, pp. 42–46.
Automatic IC Dynamic Testers, T. Dreher & D. Johnson, Solid State Technology, vol. 12, No. 3, Mar. 1969, pp. 31–35.

*Primary Examiner*—R. V. Rolinec
*Assistant Examiner*—Vincent J. Sunderdick
*Attorney, Agent, or Firm*—Lucian C. Canepa

[57] ABSTRACT

Functional and parametric checks of a circuit to be tested are in effect conducted concurrently. Equivalent loads are connected to the circuit and the loads are programmable under control of a test system. In that way, various different fan-in and fan-out capabilities as well as other parameters of the circuit may be sequentially checked without disconnecting the system from the circuit and while functional testing is taking place.

7 Claims, 3 Drawing Figures

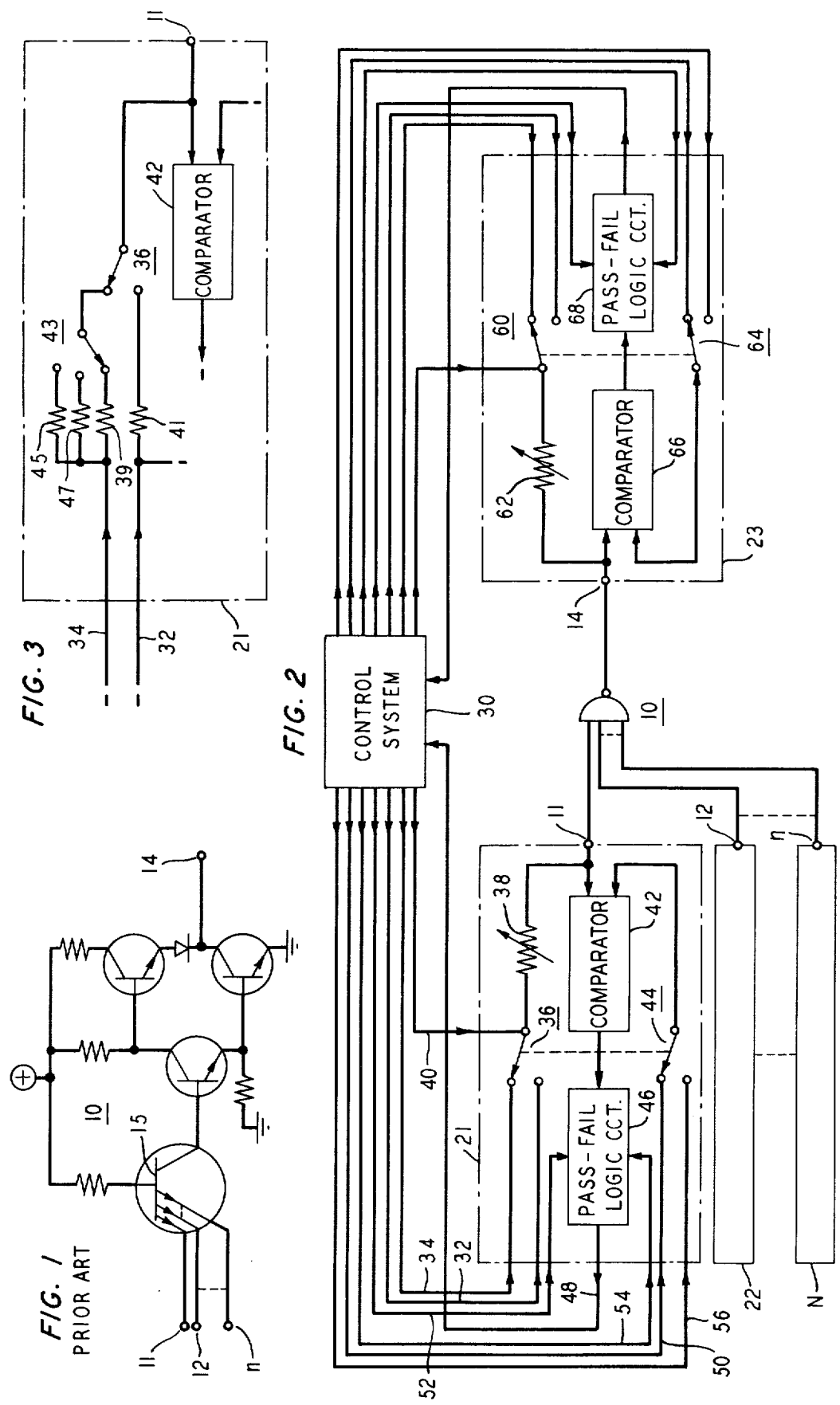

METHOD AND APPARATUS FOR TESTING CIRCUITS

BACKGROUND OF THE INVENTION

This invention relates to the testing of electrical devices and, more particularly, to an apparatus and a method for performing both functional and parametric tests on complex circuits in a high-speed manner.

Testing an electrical device such as a complex integrated circuit is a relatively time-consuming and expensive process. The process usually includes conducting both functional and parametric tests. Functional tests require the availability of sets of input signals and corresponding sets of standard output signals. The correspondence therebetween is defined by a truth table or function table which in effect represents the desired operation of the circuit to be tested. Functional tests involve applying a set of input signals to the respective input terminals of the circuit under test. Output signals thereby generated by the circuit under test are applied to a comparator to which are also applied the standard corresponding set of output signals. In this way, the overall capability of the circuit under test to perform a specified logical function can be determined.

Functional testing alone is usually insufficient to provide assurance that a circuit can work with other interconnected circuits in a system context. To provide this assurance, other capabilities of the circuit must be tested. These other capabilities include fan-out (the ability of the circuit to drive other circuits) and fan-in (the load presented to other circuits by the circuit under test). Checking such other capabilities falls under the heading of parametric testing.

Parametric testing as heretofore practiced is typically done a terminal at a time. Further, plural test boards may have to be sequentially connected to a given terminal to test various different parameters of the circuit. It is apparent that such a conventional testing procedure is inherently slow and therefore relatively expensive.

SUMMARY OF THE INVENTION

Accordingly, an object of the present invention is to improve the manner in which functional and parametric testing of an electrical device is performed.

More specifically, an object of this invention is to perform such testing in a high-speed way.

Briefly, these and other objects of the present invention are realized in a specific illustrative test system embodiment in which functional and parametric tests of an integrated circuit are conducted concurrently. Thus, for example, the ability of an output terminal of the circuit to drive other circuits is tested during functional testing by providing a Thevenin load for the terminal. Similarly the load presented to a driving circuit by the input terminal of an integrated circuit is checked during functional testing. By making the loads programmable under control of the test system, various different fan-in and fan-out capabilities as well as other parameters of the circuit are sequentially determined without disconnecting the system from the circuit and while functional testing is taking place.

BRIEF DESCRIPTION OF THE DRAWING

FIG. 1 shows a particular prior-art circuit whose testing will serve to illustrate the principles of the present invention;

FIG. 2 is a schematic depiction of a specific illustrative testing apparatus that embodies the principles of this invention; and FIG. 3 represents a modification of the FIG. 2 arrangement.

DETAILED DESCRIPTION

For ease of presentation and by way of a specific example only, emphasis herein will be directed to the testing of a simple multiple-input single-output transistor-transistor logic (TTL) circuit. It is to be clearly understood, however, that the principles of the present invention are applicable to the testing of a wide variety of electrical devices and circuits including those with both multiple inputs and multiple outputs. In addition, these principles are applicable to the testing of sequential logic circuits as well as combinatorial logic circuits.

Moreover, although the primary utility and value of the invention are particularly evident in connection with the testing of complex integrated circuits, it is apparent that the principles of the invention are also applicable to the testing of discrete-component electrical circuits.

FIG. 1 shows a conventional TTL circuit 10 which is intended to operate as a NAND gate. The circuit 10 includes $n$ input terminals 11, 12 ... $n$ and a single output terminal 14. The structure, function and operation of TTL circuits are well known in the art. Such circuits as heretofore fabricated have been constructed both as single gates and as multiple-gate arrays in both discrete-component and integrated-circuit form.

As is well known, the intended functional operation of the circuit 10 is defined by a so-called truth table. The truth table comprises a listing of all possible unique sets of "1" and "0" signals that are respectively applied to input terminals 11, 12 ... $n$. For each different set of input signals a corresponding "1" or "0" standard output signal representation is listed in the table.

In actual practice the circuit 10 is functionally tested by applying successive sets of input signals thereto in accordance with its truth table. For each such applied set the circuit provides an output signal. Comparison of this actual output signal with a standard or reference output signal specified by the truth table serves to test whether or not the circuit is functioning in its intended logical fashion.

But, as mentioned above, functional testing alone is usually insufficient to provide assurance that a circuit will work satisfactorily with other interconnected circuits in an overall system context. Other capabilities of the circuit under test (such as, for example, fan-in and fan-out) must also be tested to provide such assurance.

For purposes of a specific illustrative example, it will be assumed herein that the input signals applied to the terminals 11, 12 ... $n$ of the circuit 10 of FIG. 1 are each either a relatively high positive voltage level or a relatively low positive voltage level. These levels are interpreted as being respectively representative of "1" and "0" signals. In response to such input signals, the output terminal 14 is established at either a relatively high positive voltage level or a relatively low positive voltage level, as prescribed by the truth table of the circuit 10.

To assure adequate operating margins in a circuit such as the one shown in FIG. 1, various constraints are typically placed on certain parameters of the circuit. Thus, for example, it may be specified that in actual operation in a system context the relatively high positive voltage level established at an input terminal must never be less than a particular value designated $V_{IH}$. In addition, it may be specified that the relatively low positive voltage level established on an input terminal must never be more than a value designated $V_{IL}$. Similarly, it may be specified that the relatively low positive voltage level established at the output terminal of the FIG. 1 circuit not be more than a value $V_{OL-MAX}$.

In an actual operating system context, the aforespecified maximum and minimum voltage levels for the input and output terminals of the FIG. 1 circuit may be violated. If that occurs, the system may not operate in its intended way. Accordingly, a complete testing procedure for such an individual circuit must check certain parameters of the circuit under specified operating conditions. If the parameters are found to fall within a prescribed range, assurance is thereby provided that the circuit will operate satisfactorily when it is interconnected with other circuits in an actual system.

When a specified voltage $V_{IH}$ is established at any of the input terminals of the FIG. 1 circuit by means external to the circuit, an input current, $I_{IH}$, will flow in the respective emitter of transistor 15. The magnitude of $I_{IH}$ depends on the actual transistor parameters, resistances and other integrated parameters of the FIG. 1 circuit. In a correctly designed and fabricated fault-free circuit $I_{IH}$ will not exceed a specified value designated $I_{IH-MAX}$. Further, if a specified voltage $V_{IL}$ is established at an input terminal by external means, an input current $I_{IL}$ will flow. In a fault-free circuit this current will not exceed, in absolute magnitude, the specified value $I_{IL-MAX}$.

With the circuit of FIG. 1 in a condition such that the output terminal 14 is at the relatively high positive level and with a specified current $I_{OH}$ established by external means, flowing from left to right at the output terminal 14, a voltage $V_{OH}$ will result. For a fault-free circuit $V_{OH}$ will exceed a specified value designated $V_{OH-MIN}$. Similarly, with the output terminal 14 at the relatively low voltage state and with an externally established current $I_{OL}$, the voltage $V_{OL}$, at the output will not exceed the specified value $V_{OL-MAX}$.

By referring to the specified values $I_{IH-MAX}$, $V_{IH}$, $I_{IL-MAX}$, $V_{IL}$, $V_{OL-MAX}$, $I_{OL}$, $V_{OH-MIN}$ and $I_{OH}$, one can easily calculate fan-in, fan-out and noise margins. A properly manufactured fault-free circuit, that is, one whose specified values meet the aforedescribed criteria, will operate in an interconnected system environment within prescribed limits.

As heretofore practiced, checking above-specified input and output parameters of a circuit such as the FIG. 1 arrangement involves a parametric checking cycle that is separate and distinct from the aforedescribed functional testing cycle. Typically the parameter-checking cycle involves establishing a specified voltage at a selected one of the input terminals while applying a reference voltage to all the other input terminals. The current flowing into the selected terminal is then measured and compared to some specified maximum value. This procedure is then followed in sequence for each of the other input terminals. A similar terminal-by-terminal sequential procedure must then be followed to determine whether or not the output terminal parameters fall within prescribed limits. Such a testing procedure is obviously time-consuming and, therefore, relatively expensive, especially when a complex large-scale-integrated circuit having multiple inputs and outputs is to be completely tested.

In accordance with one aspect of the principles of the present invention, functional and parametric tests of an electrical device or circuit are in effect conducted concurrently. Advantageously, this done by means of the specific illustrative arrangement shown in FIg. 2. In FIg. 2 the circuit 10 to be tested is assumed for purposes of a simple particular example to be identical to the circuit specified hereinabove in connection with the description of FIG. 1. The input and output terminals of the circuit 10 of FIG. 2 are designated with the same reference numerals employed therefor in FIG. 1.

In FIG. 2 plural circuits 21, 22, 23 . . . N are each enclosed within a dashed-line box and are shown respectively connected to the input and output terminals of the circuit 10. The circuits 21, 22, 23 . . . N are controlled by and, in turn, supply status signals to a central control system 30. The system 30 may comprise part of a conventional test system. Alternatively, the system 30 may comprise a special-purpose control unit whose configuration and operation will be evident to one skilled in the art in view of the detailed description herein. Or the system 30 may constitute a conventional general-purpose computer combined with programmable power supplies and programmable timing generators and programmed in a straightforward way to interface with the circuits 21, 22, 23 . . . N.

Logical input signals supplied by the control system 30 of FIG. 2 are applied via the circuits 21, 22 . . . N to the input terminals 11, 12 . . . n of the circuit 10 to be tested. Thus, for example, relatively high and relatively low input signals supplied by the system 30 are applied by means of leads 32 and 34, switch 36 and resistor 38 to input terminal 11 of the circuit 10. In its simplest form, the switch 36 comprises a conventional mechanical unit. But advantageously the switch 36 is an electro-mechanical or electronic unit whose condition is remotely controlled in a high-speed manner by signals applied thereto by the system 30 via lead 40. Reed relays or field-effect transistor switches are only illustrative of some of the known devices from which to construct the switch 36 and the other switches to be described hereinbelow.

The signal applied to the input terminal 11 of the circuit 10 shown in FIG. 2 is also applied to one input terminal of a conventional voltage comparator 42. Reference or standard relatively high and relatively low input signals also supplied by the control system 30 are applied via another switch 44 to the other input terminal of the comparator 42. In form and operation the switch 44 may, for example, be identical to the unit 36. Illustratively the switches 36 and 44 are operated in unison by signals appearing on the lead 40. In that case in particular, of course, it may be advantageous to combine the switches 36 and 44 in a single unitary assembly. In accordance with the principles of the present invention, the resistor 38 of FIG. 2 may be variable in some embodiments, as described hereinbelow.

The output of the comparator 42 is applied to a strobed pass-fail logic circuit 46 whose nature and operation will be described in more detail later below. The output of the circuit 46 is applied via lead 48 to the control system 30. By this means the system 30 is signalled with respect to the status of tests being performed on the circuit 10.

Assume, to take a specific example, that the levels $V_{IH}$ and $V_{IL}$ are specified to be 2.4 and 0.4 volts, respectively. Moreover, assume that for the particular circuit 10 depicted in FIG. 2 $I_{IH-MAX}$ and $I_{IL-MAX}$ are specified to be 40 microamperes and 1.6 milliamperes, respectively. With those parameters specified it is then possible to calculate a value for the resistor 38 which will serve to monitor whether or not $I_{IH-MAX}$ or $I_{IL-MAX}$ is exceed during functional testing of the circuit 10. More specifically, if $I_{IH-MAX}$ is exceeded, the drop across the resistor 38 will cause the voltage at input terminal 11 to fall below $V_{IH}$ when the switch 36 is in its upper position. And if $I_{IL-MAX}$ is exceeded, the drop across the resistor 38 will cause the voltage at terminal 11 to exceed $V_{IL}$ when the switch 36 is in its lower position.

In one specific illustrative embodiment of the arrangement shown in FIG. 2 the resistor 38 was set, for reasons of measurement sensitivity and accuracy, to a value of 5000 ohms. In that case the relatively high positive voltage level applied to line 34 by the system 30 to establish a voltage of at least 2.4 volts at input terminal 11, for any input current condition of 40 microamperes or less is readily calculated to be 2.6 volts. This relatively high level applied to line 34 will be designated $EI_{IN}$. Similarly, for the particular case wherein the resistor 38 has a value of 5000 ohms, the relatively low voltage level applied to line 32 by the system 30 to establish a voltage of no more than 0.4 volts at input terminal 11, for any input current condition of 1.6 milliamperes or less, is −7.6 volts. This relatively low level applied to lne 32 will be designated $EO_{IN}$.

If the switch 36 is set at the position indicated in FIG. 2, 2.6 volts are applied to the lefthand end of the resistor 38. For purposes of functional testing the level at input 11 resulting from the level $EI_{IN}$ is considered, for example, to represent a "1" signal. At the same time that the input terminal 11 of the circuit 10 is in effect being functionally exercised, the resistor 38 serves to monitor left-to-right current flow through the terminal 11. If this flow exceeds 40 microamperes, the drop across the resistor 38 will exceed 0.2 volts and the voltage applied to the terminal 11 and to one input of the comparator 42 will therefore fall below 2.4 volts (which is $V_{IH}$). A standard or reference voltage level $ER1_{IN}$ having the value of 2.4 volts is applied by the system 30 via lead 50 and the upper contact of the switch 44 to the other or lower input terminal of the comparator 42. Accordingly, the occurrence of such an excessive current flow will cause the voltage applied to the upper terminal of the comparator 42 to be less than the reference level applied to the lower terminal thereof. In turn, a signal indicative of the relative values of the comparator inputs is applied by the unit 42 to the logic circuit 46. Another input to the circuit 46 is derived from the control system 30 via lead 52. For a reason that will become apparent below, this signal on lead 52 is set by the system 30 to have one binary value (for example, "1") when $EI_{IN}$ is applied to the resistor 38 and the other binary value ("0") when $EO_{IN}$ is applied to the resistor 38. In addition, the system 30 applies a strobe signal to the circuit 46 via lead 54. This last-mentioned signal is timed to occur after the output of the comparator 42 has reached a steady-state condition.

Thus, for the case wherein $EI_{IN}$ is applied to the resistor 38, the output of the circuit 46 of FIG. 2 is applied to the system 30 via lead 48 to provide a signal indicative of whether or not the parameter $I_{IH-MAX}$ has been exceeded.

On the other hand, assume that the switch 36 of FIG. 2 is controlled to apply −7.6 volts, which appears on lead 32, to the resistor 38. This level, $EO_{IN}$, is considered, for example, to represent a "0" signal during functional testing. If the right-to-left current flow through the terminal 11 exceeds 1.6 milliamperes during such testing, the drop across the resistor 38 will exceed 8 volts. The polarity of this drop is such that the voltage applied to the terminal 11 and to the upper input terminal of the comparator 42 would then exceed 0.4 volts (which is $V_{IL}$). A standard or reference voltage level $ERO_{IN}$ having the value 0.4 volts is applied by the system 30 via lead 56 and the lower contact of the switch 44 to the lower input terminal of the comparator 42. Accordingly, the occurrence of such an excessive current flow will cause the voltage applied to the upper terminal of the comparator 42 to be greater than the reference level applied to the lower terminal thereof. Since, for this error condition, the relative magnitudes of the comparator inputs are just the opposite of the earlier case assumed above with respect to $I_{IH-MAX}$, it is apparent that the logical signal information applied to the circuit 46 via lead 52 is necessary to establish a basis for the circuit 46 providing a pass or fail output signal. This is so because in the case wherein "1" signal input is applied to the terminal 11 and $I_{IH-MAX}$ is being monitored, an error condition is to be indicated of the input level applied to the upper terminal of the comparator 42 is greater than $ER1_{IN}$. On the other hand, when a "0" signal is applied to the terminal 11 and $I_{IL-MAX}$ is being checked, an error condition is to be indicated if the input level applied to the upper terminal of the comparator 42 is less than $ERO_{IN}$. Illustratively, as is well known in the art, the capability of distinguishing between these cases may be easily provided in the circuit 46 by a simple EXCLUSIVE-OR unit whose output is inverted. The inputs to such a unit are the output of the comparator 42 and the aforespecified signal appearing on line 52. In addition, as mentioned above, the output of the circuit 46 is advantageously strobed by a signal on line 54.

In accordance with another basic aspect of the principles of the present invention, the aforedescribed load included in each of the circuits 21, 22 . . . N of FIG. 2 and connected to the input terminals 11, 12 . . . n is variable. Advantageously, variation of the loads is controlled by the system 30 in a programmed way. Thus, for example, the value of the resistor 38 in the circuit 21 may be varied in accordance with a prescribed testing format by electrical control signals supplied by the system 30. In such a case, complete electrical isolation between the signal source and the controlled resistor is advantageous. One particular conventional way of accomplishing remote control of the value of the resistor 38 in an electrically isolated way is by means of light-dependent resistors. Such resistors and appropriate control circuits therefor are described, for example, in an article in *Electronic Design*, pp. 149–150, Oct. 25, 1974, and in U.S. Pat. Nos. 3,327,239, 3,423,579 and 3,497,717.

Alternatively, the load connected to each of the input terminals 11, 12 . . . n of the circuit 10 of FIG. 2 may be selectively varied by letting the value of the resistor 38 remain fixed but changing the value of $EO_{IN}$ or $EI_{IN}$ appearing on lines 32 and 34, respectively. This latter change is easily accomplished by including conventional programmed voltage sources in the control system 30.

By changing the values of the loads respectively connected to the input terminals 11, 12 . . . n of FIG. 2, the pass-fail criteria established in the aforedescribed parametric testing procedure are easily varied. More specifically, assume, for example, that $E1_{IN}$ remains set at 2.6 volts but that the value of the resistor 38 is changed by the system 30 to a value of 1667 ohms. In that particular case $V_{IH}$ would not fall below 2.4 volts unless $I_{IH}$ exceeds 120 microamperes. (Recall that in the case wherein the resistor 38 had a value of 5000 ohms, $V_{IH}$ would fall below 2.4 volts whenever $I_{IH}$ exceeded 40 microamperes.)

The same illustrative result described above, that is, setting $I_{IH-MAX}$ at a new value of 120 microamperes, can be accomplished by leaving the value of the resistor 38 of FIG. 2 fixed at 5000 ohms but changing the value of $E1_{IN}$ from 2.6 volts to 3 volts. Whichever of these values is selectively changed by the system 30, the effect is the same, namely, to change the values of the simulated loads respectively connected to the input terminals of the circuit 10 during functional testing. Such a change simulates in effect different fan-in conditions for the circuit 10 under test.

In addition, in some applications of practical interest it is advantageous to provide another alternative to the variable-load configurations described above. In this other alternative, schematically depicted in FIG. 3, two different-valued resistors 39 and 41 are respectively inserted in series in the lines 32 and 34 to the left of the switch 36 in the circuit 22. (Only a portion of the modified circuit 21 is shown in FIG. 3. The remainder of the circuit may be identical to the particular arrangement depicted in FIG. 2.) The FIG. 3 alternative has the advantage that the values of the resistors 39 and 41 may be selected to establish a relatively small difference between the voltages required to be applied to lines 32 and 34. Such a relatively small difference between $E0_{IN}$ and $E1_{IN}$ is advantageous in that the range of voltages required to be supplied by programmable voltage sources included in the system 30 is thereby reduced.

Assume, for example, that the value of the resistor 39 of FIG. 3 is selected to be 10,000 ohms (for relatively high sensitivity), that $V_{IH}$ is 2.4 volts and that $I_{IH-MAX}$ is 40 microamperes. In that case $E1_{in}$ is 2.8 volts. The resistor 41, on the other hand, may be selected to be only 500 ohms, whereby $E0_{IN}$ is then only −0.4 volts. ($I_{IL-MAX}$ is 1.6 milliamperes, and $V_{IL}$ is 0.4 volts.)

Moreover, by conventional electromechanical or electronic means, a specified one of several fixed resistors having respectively different values may be selectively switched into the position of resistor 38 in FIG. 2 or into the position of resistor 39 or resistor 41 in FIG. 3. (See, for example, switch 43 in FIG. 3 which is utilized to connect resistor 45 or resistor 47 in line 34 in place of resistor 39.) This provides the capability for easily monitoring different orders of magnitude of input current flow typical of different devices in various different technologies. Advantageously the circuits 22 . . . N respectively connected to the other input terminals 12 . . . n of the circuit 10 of FIG. 2 are identical to the circuit described in detail above. Additionally, the interconnections between the circuits 22 . . . N and the control system 30 are advantageously the same as those specified above between the circuit 21 and the system 30.

Moreover, the configuration and mode of operation of the circuit 23 connected to the output terminal 14 of the circuit 10 of FIG. 2 are advantageously the same as those of the aforedescribed circuit 21. In the circuit 23 the voltages applied to the top and bottom contacts of switch 60 are respectively designated by $E1_{OUT}$ and $E0_{OUT}$ which, for example, are associated with "1+ and "0" signals, respectively. Again, to take a specific illustrative example, assume that, to insure adequate margins in the system environment in which the circuit 10 is to be connected, $V_{OH-MIN}$ and $V_{OL-MAX}$ are specified to be 2.4 and 0.4 volts, respectively. In addition, assume that $I_{OH}$ and $I_{OL}$ are specified to be 0.4 and 16 milliamperes, respectively. ($I_{OH}$ will be assumed to flow through output terminal 14 from left to right in FIG. 2 and $I_{OL}$ will be assumed to flow from right to left.) For this particular case, and following the same design procedure described above in connection with the resistor 38, the value of variable resistor 62 in the circuit 23 is set at 1000 ohms. In that case the value of $E1_{OUT}$ to be applied to the upper terminal of the switch 60 by the system 30 to establish a voltage of at least 2.4 volts at output terminal 14, for any output current condition of 0.4 milliamperes or less, is readily calculated to be 2.0 volts. Similarly, the value of $E0_{OUT}$ required to establish a voltage of no more than 0.4 volts at output terminal 14, for any output current condition of 16 milliamperes or less, is 16.4 volts.

For the particular example described above, a standard or reference voltage $ER1_{OUT}$ having the value 2.4 volts is applied by the system 30 of FIG. 2 to the upper contact of switch 64. In addition, a reference voltage $ER0_{OUT}$ having the value 0.4 volts is applied by the system 30 to the lower contact of the switch 64. Accordingly, in the same general manner described above in connection with the description of the circuit 21, the circuit 23 is effective to provide an error signal whenever the parameters $I_{OH}$ or $I_{OL}$ are exceeded.

Illustratively, the switches 60 and 64 are operated in unison. Whenever, for example, the system 30 determines from the logic truth table of the circuit 10 under test that a "1" signal should appear at the output terminal 14, the switches are controlled to be in their respective upper (depicted) positions. In that position, $E1_{OUT}$ is applied via the switch 60 to the righthand end of the resistor 62 and $ER1_{OUT}$ is applied via the switch 64 to the lower input terminal of comparator 66. If the voltage at the output terminal 14 is representative of a "1" signal and has a value greater than 2.4 volts, a pass signal will be supplied by logic circuit 68 to the system 30. Otherwise a fail or error signal will be provided thereby. A similar checking cycle occurs whenever $E0_{OUT}$ and $ER0_{OUT}$ are applied to the circuit 23 by the system 30.

Again, it is emphasized that the circuit 10 shown in FIG. 2 is only a simplified example of the types of electrical devices and circuits that can be tested in accordance with the principles of the present invention. Many typical such circuits amenable to being tested by the overall arrangement of FIG. 2 include multiple output terminals. In such cases the FIG. 2 arrangement includes multiple circuits, each advantageously identical to the circuit 23, respectively connected to the output terminals. Moreover, numerous different circuit parameters other than those specifically considered above can be checked by the depicted arrangement during functional testing of a circuit. Significantly, the parametric checking that occurs in accordance with the invention is effective to test all input and output terminals simultaneously during functional testing. The savings in time that result from this unique approach are particularly striking when complex large-scale-integrated circuits are tested in this manner.

The parametric testing or checking discussed hereinabove is of a pass-fail or go-no-go nature. Advantageously, the equipment of FIG. 2 also may be used to measure the parameters of a circuit under test. Measurements of either the force voltage-measure current or force current-measure voltage type can be made. For example, at the input terminal 11 of FIG. 2 the magnitude of $I_{IH}$ may be measured by the following sequence of operations conducted under control of the control system 30. First, the resistor 38 is set to a known value selected by considerations of measurement sensitivity and accuracy. Second, the reference voltage $ER1_{IN}$ applied to the switch 44 by conductor 50 is set to $V_{IH}$, the desired voltage condition at input 11 when the measurement is to be made. Next the voltage $E1_{IN}$ applied to switch 36 by conductor 34 is varied by the controller 30 to the point at which the comparator 42 detects that input 11 is equal to the reference voltage $ER1_{IN}$. $E1_{IN}$ may be varied by any of a number of well-known search algorithms, such as a conventional binary search. When the search is completed, input terminal 11 is established at $V_{IH}$. The current $I_{IH}$ may be automatically calculated by the system 30 from the known values of $V_{IH}$, the resistor 38, and the voltage $E1_{IN}$ as determined at the end of the binary search.

In the above specific illustrative example, the voltage $V_{IH}$ was established or forced at the input pin and the current $I_{IH}$ was measured indirectly. A force current-measure voltage type of parametric measurement can also be made with the same apparatus by the following sequence. First, set the load resistor, for example, the resistor 62 of FIG. 2, to a suitable value. Second, set the difference between the reference voltages, for example $E1_{OUT}$ and $ER1_{OUT}$, to a value such that the voltage difference divided by the selected resistance of resistor 62 equals the desired forcing current. Third, by a binary search technique or other standard searching techniques, vary $E1_{OUT}$ and $ER1_{OUT}$ while maintaining a constant difference between them as established in the second step. This is continued until the comparator 66 detects that the output at terminal 14 and the reference voltage $ER1_{OUT}$ are equal. When the search is complete, the current forced is the current established in the second step and the measured voltage is the value of $ER1_{OUT}$ at the completion of the search.

Finally, it is to be understood that the abovedescribed arrangements and testing methods are only illustrative of the application of the principles of the present invention. In accordance with those principles, numerous modifications thereof may be devised by those skilled in the art without departing from the spirit and scope of the invention.

What is claimed is:

1. Apparatus for testing an electrical device having multiple input and output terminals, the intended functional operation of said device being represented by a logical truth table or function table, said testing being intended to assure that the prescribed functional capabilities of the device as well as specified parameters of the device conform to design standards, said apparatus comprising plural variable loads respectively connected to the input and output terminals of said device,
means for setting said loads to values corresponding to device parameters to be tested,
means for applying successive sets of fixed input and output signals to said device via said respective variable loads in accordance with said table,
means for providing reference signals,
and means connected to the input and output terminals of said device for comparing the actual signals appearing thereat with said reference signals and for providing an error indication in the event that the relative magnitudes of any corresponding pair of actual and reference signals deviates from a prescribed relationship.

2. Apparatus as in claim 1 wherein each of said variable loads comprises a resistor having one end connected to its respective input or output terminal and the other end connected to a voltage source.

3. Apparatus as in claim 2 wherein said comparing and providing means comprises a comparator unit and a pass-fail logic unit associated with each different one of said input and output terminals, said comparator unit being responsive to the actual signal appearing at its associated input or output terminal and to the corresponding reference signal for applying to said logic unit a signal indicative of the relative magnitudes of said actual and reference signals.

4. Apparatus as in claim 3 wherein said setting means is adapted to vary the value of each of said resistors.

5. Apparatus as in claim 3 wherein said setting means is adapted to vary the value of each of said voltage sources.

6. Apparatus for testing a multiple-input circuit whose intended functional operation is represented by a truth table or function table, said testing being intended to insure that the prescribed functional capabilities of the circuit as well as specified parameters of the circuit conform to design standards, said apparatus comprising means for applying sets of signals to the respective inputs of said circuit to simulate input conditions represented by said truth table or function table,
means for providing a standard output signal representation for each set of applied input signals,
and means for comparing the actual output representation provided by said circuit in response to each set of applied input signals with the corresponding standard output signal representation,
characterized in that said apparatus also includes means connected to the inputs and outputs of said circuit to provide respective simulated loads therefor during the functional testing of said circuit so that parametric testing of said circuit is conducted during the functional testing thereof,
means for varying the values of the loads connected to said circuit so that different parametric tests may be conducted during functional testing,
and means for providing an error signal to indicate a failure of either said functional testing or said parametric testing.

7. A method for testing circuits of the type that include multiple input and output terminals, the intended functional operation of said circuit being represented by a logical truth table or function table, said testing being intended to assure that the prescribed functional capabilities of the circuit as well as specified parameters of the circuit conform to design standards, said method comprising the steps of connecting plural variable loads to the respective input and ouput terminals of said circuit,
setting said loads to values corresponding to circuit parameters to be tested, applying successive sets of fixed input and output signals to said circuit via said respective variable loads in accordance with said table, comparing the actual signal appearing at each of said input and output terminals with a reference signal, and generating an error indication in the event that the relative magnitudes of any corresponding pair of actual and reference signals deviates from a prescribed relationship.

* * * * *

UNITED STATES PATENT AND TRADEMARK OFFICE
CERTIFICATE OF CORRECTION

PATENT NO. : 4,002,974

DATED : January 11, 1977

INVENTOR(S) : Edward W. Thomas

It is certified that error appears in the above–identified patent and that said Letters Patent are hereby corrected as shown below:

Column 3, line 50, "checking above-specified" should read --checking the above-specified--. Column 4, line 4, "this done" should read --this is done--. Column 4, line 57, "embodiments," should read --embodiments and fixed in other embodiments,--. Column 4, line 68, "FIG. $2I_{IH-MAX}$" should read --FIG. 2 $I_{IH-MAX}$--. Column 5, line 5, "exceed" should read --exceeded--. Column 5, line 27, "lne" should read --line--. Column 6, line 24, "of" should read --if--. Column 7, line 42, "$EI_{In}$" should read --$EI_{IN}$--. Column 7, line 59, "circuit" should read --circuit 21--. Column 8, line 1, "designated by" should read --designated--. Column 8, line 2, "'1+" should read --"1"--. Column 9, line 46, "abovede-" and column 9, line 47, "scribed" should read --above-described--.

Signed and Sealed this

Nineteenth Day of April 1977

[SEAL]

Attest:

RUTH C. MASON
*Attesting Officer*

C. MARSHALL DANN
*Commissioner of Patents and Trademarks*